(12) United States Patent
Katori

(10) Patent No.: US 7,459,673 B2
(45) Date of Patent: Dec. 2, 2008

(54) ATOMIC DEVICE

(75) Inventor: Hidetoshi Katori, Urayasu (JP)

(73) Assignee: Japan Science and Technology Agency, Saitama (JP)

( * ) Notice: Subject to any disclaimer, the term of this patent is extended or adjusted under 35 U.S.C. 154(b) by 330 days.

(21) Appl. No.: 10/548,903

(22) PCT Filed: Mar. 12, 2004

(86) PCT No.: PCT/JP2004/003343

§ 371 (c)(1),
(2), (4) Date: Jul. 13, 2006

(87) PCT Pub. No.: WO2004/082027

PCT Pub. Date: Sep. 23, 2004

(65) Prior Publication Data

US 2007/0158541 A1    Jul. 12, 2007

(30) Foreign Application Priority Data

Mar. 13, 2003    (JP) .............................. 2003-068764

(51) Int. Cl.
*H05H 3/00* (2006.01)

(52) U.S. Cl. ...................................... 250/251

(58) Field of Classification Search ........................ None
See application file for complete search history.

(56) References Cited

U.S. PATENT DOCUMENTS

| | | | |
|---|---|---|---|
| 5,166,919 A | 11/1992 | Eigler | |
| 5,808,311 A | 9/1998 | Aono et al. | |

(Continued)

FOREIGN PATENT DOCUMENTS

| | | |
|---|---|---|
| EP | 0 687 889 | 6/1995 |
| JP | 06-224412 | 8/1994 |
| JP | 08-008475 | 1/1996 |
| JP | 2002-246585 | 8/2002 |

OTHER PUBLICATIONS

Schmiedmayer, "Quantum wires and quantum dots for neutral atoms", European Physical Journal D, 4, (1998) pp. 57-62.*
Kruger et al., "Trapping and Manipulating Neutral Atoms with Electrostatic Fields", Physical Review Letters, vol. 91, No. 23, Dec. 5, 2003, pp. 233201-1-4.*

(Continued)

*Primary Examiner*—Jack I Berman
(74) *Attorney, Agent, or Firm*—Patterson & Sheridan, L.L.P.

(57) ABSTRACT

A trapping position 30 is defined on a substrate 1, and an electrode pattern 2 is formed on the substrate 1, having a first pair of electrodes 21 including electrodes 22 and 23 formed at positions opposite each other with the trapping position 30 placed therebetween along a diagonal x-axis, and a second pair of electrodes 26 including electrodes 27 and 28 formed at positions opposite each other with the trapping position 30 placed therebetween along a y-axis orthogonal to the x-axis. The atomic device alternately switches between a first state and a second state to trap a neutral atom at the trapping position 30; in the first state, the electrode 22 of the first pair of electrodes 21 is set at a positive potential $+V_0$ with respect to a reference potential and the electrode 23 is set at a negative potential $-V_0$, and in the second state, the electrode 27 of the second pair of electrodes 26 is set at the positive potential $+V_0$ and the electrode 28 is set at the negative potential $-V_0$. This allows for realizing an atomic device which can facilitate integration of atomic circuits and reduce disturbances or the like.

9 Claims, 12 Drawing Sheets

U.S. PATENT DOCUMENTS 7,126,112 B2 * 10/2006 Anderson et al. ............ 250/251
7,375,802 B2 * 5/2008 Allen et al. ................ 356/4.01
2008/0073494 A1 * 3/2008 Hyodo ...................... 250/251

OTHER PUBLICATIONS

IPRP, International Application No. PCT/JP2004/003343, dated Feb. 23, 2006.

T. Calarco, et al., Quantum Gates With Neutral Atoms: Controlling Collisional Interactions in Time-Dependent Traps, XP-002422106, Physical Review A, vol. 61, Feb. 23, 2004.

E. Peik, Electrodynamic Trap for Neutral Atoms, XP-002422107, The European Physical Journal D, , vol. 6, May 1, 1999, pp. 179-183.

William D. Phillips, Laser Cooling and Trapping of Neutral Atoms, XP-002422108, Rev. of Modern Physics, vol. 70, No. 3, pp. 721-741, Jul. 1, 1998.

Markus Bartenstein, et al., Atoms and Wires: Toward Atom Chips, IEEE Journal of Quantum Electronics, IEEE Service Center, vol. 36, No. 12, Dec. 2000, XP-011052523.

D. Cassettari, et al., Micromanipulation of Neutral Atoms With Nanofabricated Structures, Applied Physics B, vol. 70, Apr. 5, 2000, XP-002422109.

EP Search Report, Application No. 04720187.6-2203, dated Mar. 15, 2007.

Fujio Shimizu and Makoto Morinaga, Electric Trapping of Neutral Atoms, Japanese Journal of Applied Physics, Dec. 1, 1992, vol. 31, No. 12A.

Japanese Office Action, Patent Application No. P2003-068764, dated Mar. 25, 2008.

PCT International Search Report from International Application No. PCT/JP2004/003343 dated Jul. 6, 2004.

Cassettari, D., et al., "Beam Splitter for Guided Atoms," Physical Review Letters, vol. 85, No. 26 (2000) pp. 5483-5487.

Folman, Ron, et al., "Controlling Cold Atoms using Nanofabricated Surfaces: Atom Chips," vol. 84, No. 20 (2000) pp. 4749-4752.

* cited by examiner

ATOMIC DEVICE

TECHNICAL FIELD

The present invention relates to an atomic device in which a neutral atom or a neutral molecule is trapped on a substrate for use.

BACKGROUND ART

Conventional information processing technology has employed electronics technology in which use is made of electron flows and photonics technology in which photon flows are utilized. Recently, in contrast to this, discussions have focused on the possibility of realizing an "atomic circuit" in which controlled flows of atoms are coherently operated on a substrate. Like the development of electronics or photonics in which employed is sophisticated control of electrons or photons, such an atom control technology will be potentially developed as a new information processing technology which may be referred to as "atomtronics."

In particular, particles such as atoms or molecules for use with this technology have a larger number of degrees of interior or exterior freedom resulting from their complicated structure as compared to electrons or photons. Accordingly, the establishment of the technology in which such particles are coherently controlled for use may be expected to bring profound effects on quantum information processing, quantum computing, ultimate measurement and so forth in the future (e.g., see the document: Donatella Cassettari et al., "Beam Splitter for Guided Atoms", Phys. Rev. Lett., Vol. 85, pp. 5483-5487 (2000)).

DISCLOSURE OF THE INVENTION

With an atomic substrate (atom chip) to which the aforementioned technology is applied, the method for controlling neutral atoms employs the Zeeman interaction of the atoms with a magnetic field. That is, a current is allowed to flow through a conductor wire to thereby produce a magnetic field $B(r)$. Then, the Zeeman interaction of an atom having a magnetic moment $\mu_B$ in the magnetic field yields the potential $U_B(r)=-\mu_B \cdot B(r)$, which is in turn used to trap or move the atom.

More specifically, this method combines the magnetic field produced by the current conductor wire on the substrate and an external bias magnetic field, thereby producing a minimal point of the magnetic field at a predetermined position. At this time, an atom having a magnetic moment $\mu_B$ anti-parallel to the magnetic field makes it possible to provide the minimum Zeeman potential at a minimal point in the magnetic field. Therefore, the minimal point can be employed as a trapping position at which the atom is trapped. Such an atom control principle has been used so far for atom guide by a magnetic field produced by a conducting conductor wire on a substrate, for an atom branching circuit by a Y-shaped conductor wire, and for experiments on generation of Bose condensations on a substrate. These researches have made use of the magnetic field control of an electron spin of a laser-cooled alkali atom.

However, such a conventional atom control technology has raised several problems with implementation of various atomic devices such as an atomic circuit that utilizes flows of atoms. That is, in the aforementioned technology, a current is allowed to flow through a conductor wire on a substrate to control an atom, thus inevitably resulting in the occurrence of Ohmic loss and thereby heat generation. Accordingly, this provides limitations to integration on the substrate. It is also difficult to shield a magnetic field between atomic circuits in the arrangement for controlling atoms using the magnetic field.

As can be seen from the Zeeman potential equation $U_B=-\mu_B \cdot B$, the aforementioned technology makes use of the first-order effect of a magnetic field to control the atom. Such a control method raised a problem that the atom is readily subjected to disturbances, thereby unavoidably causing decoherence to occur in building a large-scale quantum computer.

The present invention has been developed to address the aforementioned problems. It is therefore an object of the invention to provide an atomic device which facilitates integration of the atomic circuits and enables reduction of effects of disturbances.

In order to achieve such an object, an atomic device according to the present invention is an atomic device using a neutral particle which is a neutral atom or a neutral molecule, comprising (1) a first pair of electrodes provided at positions on a substrate with a trapping position disposed therebetween, and along a first axis passing through the trapping position, the trapping position being defined at a predetermined position on the substrate, and (2) a second pair of electrodes provided at positions on the substrate with the trapping position disposed therebetween, and along a second axis provided at a predetermined angle to the first axis and passing through the trapping position, wherein (3) the atomic device switches between a first state and a second state alternately to trap a neutral particle at the trapping position, one of the electrodes of the first pair of electrodes being set at a positive potential with respect to a reference potential and the other electrode being set at a negative potential in the first state, one of the electrodes of the second pair of electrodes being set at a positive potential with respect to the reference potential and the other electrode being set at a negative potential in the second state.

The aforementioned atomic device controls neutral atoms or neutral molecules using not the Zeeman interaction with a magnetic field but Stark interaction with an electric field. That is, an electric field $E(r)$ is applied to a neutral particle having a polarizability $\alpha$, and a potential of the particle resulting from Stark interaction in the electric field, $U_E(r)=-\alpha|E(r)|^2/2$, is used to trap a particle. More specifically, applied voltages to two pairs of electrodes are switched to create a stable point at a position sandwiched by those pairs of electrodes, allowing the particle to be trapped using the stable point as the trapping position.

According to such a configuration and atom control method, a voltage is applied to the electrodes on the substrate to control a particle, thus causing only power loss to occur due to the switching of the electric field. Accordingly, the occurrence of Ohmic loss and heat generation resulting therefrom can be avoided, thereby facilitating integration of atomic circuits on the substrate. Further, in the arrangement using an electric field to control atoms, the interference of electric fields between atomic circuits can be easily avoided by providing a ground surface on the substrate. These effects provide the atomic device with a high degree of integration of atomic circuits.

As can be seen from the Stark potential equation $U_E=-\alpha|E|^2/2$, the aforementioned arrangement makes use of the second-order effect of the electric field to control a particle. This allows for suppressing the coupling of the particle being controlled by its environment or a disturbance. Accordingly, such an atomic device is realized which is resistant to decoherence.

In switching between the first state and the second state, it is preferable that the two electrodes of the second pair of electrodes be set at the reference potential in the first state, and the two electrodes of the first pair of electrodes be set at the reference potential in the second state. This makes it possible to create a good stable point at a position to be sandwiched by the two pairs of electrodes.

It is also preferable that the neutral particle trapped on the substrate for use be a neutral atom or a neutral molecule having no spin. For such a particle, a long coherence time can be expected with its quantum state. This is advantageous with respect to the extensibility of the atomic circuit.

Furthermore, it is preferable that, in the atomic device, a group of electrodes made up of the first pair of electrodes and the second pair of electrodes has an electrode spacing of 10 μm or less. An electrode structure provided on the substrate is micro-structured, thereby providing a compact atomic device. Additionally, the reduced electrode spacing can decrease the applied voltage to each electrode that is necessary to create an electric field for trapping a neutral particle.

It is also preferable that the substrate for forming the atomic device thereon be a semiconductor substrate on which an electronic device or an optical device is formed. Use of a substrate having an electronic device formed thereon for combination of electronic and atomic devices would realize an interface between the electronics technology and the information processing technology using the neutral particle. In addition, use of a substrate having an optical device formed thereon for combination of optical and atomic devices makes it possible to realize an interface between the photonics technology and the information processing technology using the neutral particle.

Alternatively, it is preferable to use as the substrate a transparent substrate which transmits light of a predetermined wavelength. Using a transparent substrate for combination of the atomic device and another optical device via the substrate makes it possible to realize an interface between the photonics technology and the information processing technology using the neutral particle.

Furthermore, it is preferable that, in the atomic device, a plurality of the trapping positions are defined on the substrate, a group of electrodes made up of the first pair of electrodes and the second pair of electrodes is provided for each of the plurality of trapping positions, and a potential of each electrode included in the plurality of groups of electrodes is switched, thereby trapping the neutral particle at the trapping position and moving the neutral particle between the trapping positions adjacent to each other.

When the basic configuration of the aforementioned atomic device with two pairs of electrodes is expanded as described above, it becomes possible to realize a coherent transport of the neutral particle, thereby serving to form various atomic circuits.

In a specific arrangement of the atomic device, for example, the neutral particle to which information is attached may be used, and the plurality of groups of electrodes may be formed as an atom shift register for transferring the information by sequentially moving the neutral particle between the trapping positions adjacent to each other. Alternatively, at least two of the neutral particles to which information is attached may be used, and the plurality of groups of electrodes may be formed to be able to provide a quantum correlation to the two neutral particles. There may also be available various arrangements other than those mentioned above.

BEST MODE FOR CARRYING OUT THE INVENTION

Figure 1:
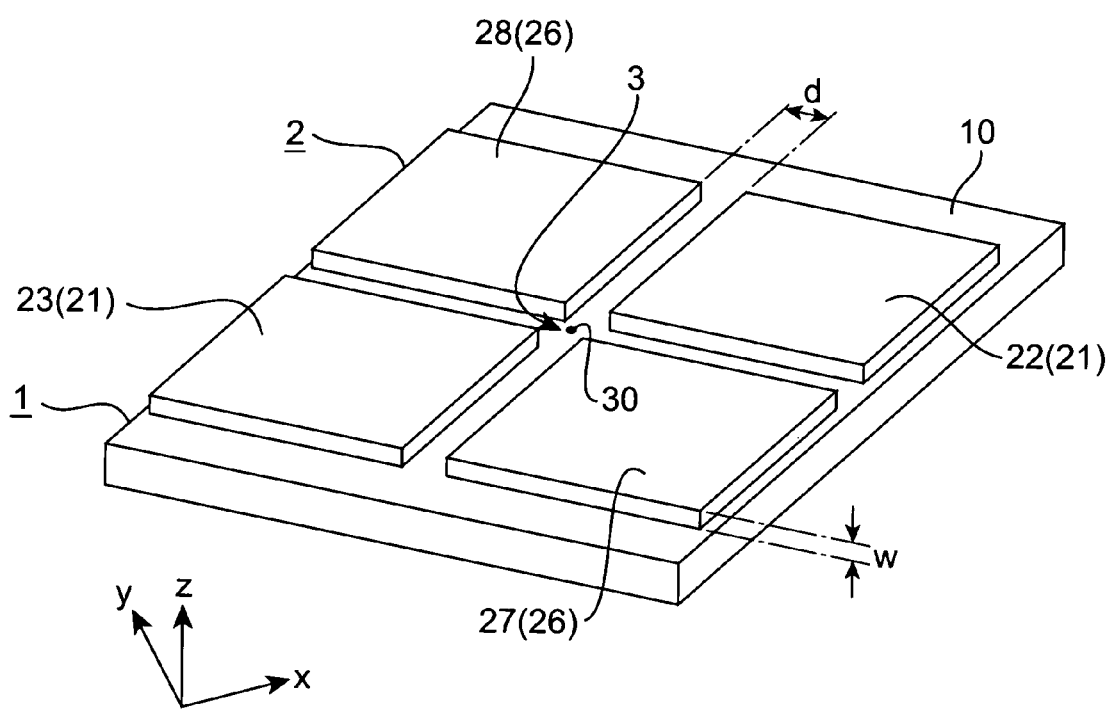
FIG. 1 is a perspective view illustrating the configuration of an atomic device according to an embodiment.

Preferred embodiments of the atomic device according to the present invention will be described below in detail with reference to the drawings. The same elements will be described by the same reference symbols in the description of the drawings, without redundant description. It is noted that the dimensional ratios in the drawings do not always agree with those in the description.

FIG. 1 is a perspective view illustrating the configuration of an embodiment of an atomic device according to the present invention. This atomic device is an atomic substrate (atom chip) which uses a neutral particle trapped on the substrate, and includes a substrate 1 and an electrode pattern 2. In the description below, such a case will be mainly illustrated where a neutral atom is employed; however, in general, a neutral atom or a neutral molecule can be employed as a neutral particle.

For convenience of description, a coordinate system including x, y, and z axes is defined as follows for use in the atomic device shown in FIG. 1. That is, it is defined that the z axis is perpendicular to the substrate 1; the x axis (first axis) orthogonal to the z axis extends along one diagonal direction of the substrate 1; and the y axis (second axis) orthogonal to the z and x axes extends along the other diagonal direction of the substrate 1. Furthermore, a predetermined position on an intersection of the x and y axes which is substantially centered on the substrate 1 is defined as a trapping position 30 at which a neutral atom is trapped in the atomic device.

The substrate 1 is a substrate formed of a predetermined material and shaped substantially in a square. The electrode pattern 2 is formed of a metal material such as silver on a surface 10 of the substrate 1. In this embodiment, the electrode pattern 2 has two pairs of electrodes; a first pair of electrodes 21 and a second pair of electrodes 26. Here, at least a region on the surface 10 of the substrate 1 is kept in an ultrahigh vacuum such as for trapping a neutral atom.

The first pair of electrodes 21 has a set of electrodes 22 and 23. These electrodes 22 and 23 are each formed in the shape of a rectangle along the outer shape of the substrate 1, and are provided at positions on the substrate 1, respectively, with the trapping position 30 disposed therebetween, along the x axis passing through the trapping position 30. In FIG. 1, the electrode 22 is disposed at the upper right side of the substrate 1, while the electrode 23 is disposed at the lower left side.

The second pair of electrodes 26 has a set of electrodes 27 and 28. These electrodes 27 and 28 are each formed in the shape of a rectangle along the outer shape of the substrate 1, and are provided at positions on the substrate 1, respectively, with the trapping position 30 disposed therebetween, along the y axis passing through the trapping position 30. In FIG. 1, the electrode 27 is disposed at the lower right side of the substrate 1, while the electrode 28 is disposed at the upper left side. These electrodes 22, 23, 27, and 28 are provided with a predetermined electrode spacing d, and a thickness w.

In this atomic device, the aforementioned two pairs of electrodes 21 and 26 constitute a group of electrodes used for trapping a neutral atom. In such an electrode configuration, the pairs of electrodes 21 and 26 surround a region on the substrate surface 10 to define a trapping region 3, at the center position of which is the trapping position 30 for a neutral atom. The electric potentials of the electrodes 22, 23, 27, and 28 that constitute the pairs of electrodes 21 and 26 are each switched over alternately between two states, a first state and a second state, thereby allowing a neutral atom to be trapped at the trapping position 30.

That is, within the trapping region 3, an electric field E is produced corresponding to the potential of each electrode of the electrode pattern 2. At this time, a neutral atom having a polarizability $\alpha$ to be trapped will have a potential $U_E = -\alpha|E|^2/2$ resulting from the Stark interaction. The atomic device shown in FIG. 1 makes use of this Stark potential resulting from the electric field to realize trapping of the neutral atom.

More specifically, the ground potential is first defined as the reference potential for the electric potential in the atomic device, and two states are defined for the potential of each electrode. In the first state, a voltage $+V_0$, a positive potential relative to the ground potential, is applied to the one electrode 22 that constitutes the first pair of electrodes 21, with a voltage $-V_0$, a negative potential, applied to the other electrode 23. Additionally, the two electrodes 27 and 28 that constitute the second pair of electrodes 26 are set to the ground potential G. On the other hand, in the second state, a voltage $+V_0$ is applied to the one electrode 27 that constitutes the second pair of electrodes 26, with a voltage $-V_0$ applied to the other electrode 28. Additionally, the two electrodes 22 and 23 that constitute the first pair of electrodes 21 are set to the ground potential G. The present atomic device allows for switching between these states to thereby trap an atom at the trapping position 30.

Figure 2A:
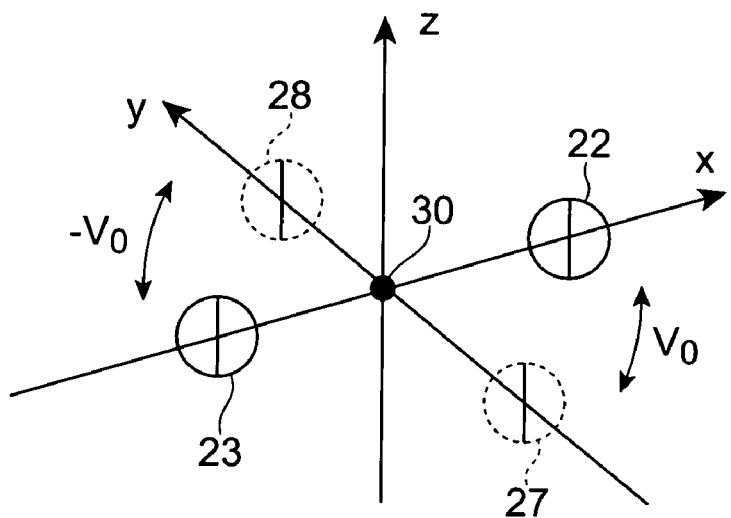
FIGS. 2A and 2B are explanatory views illustrating how to trap a neutral atom in the atomic device shown in FIG. 1.
Figure 2B:
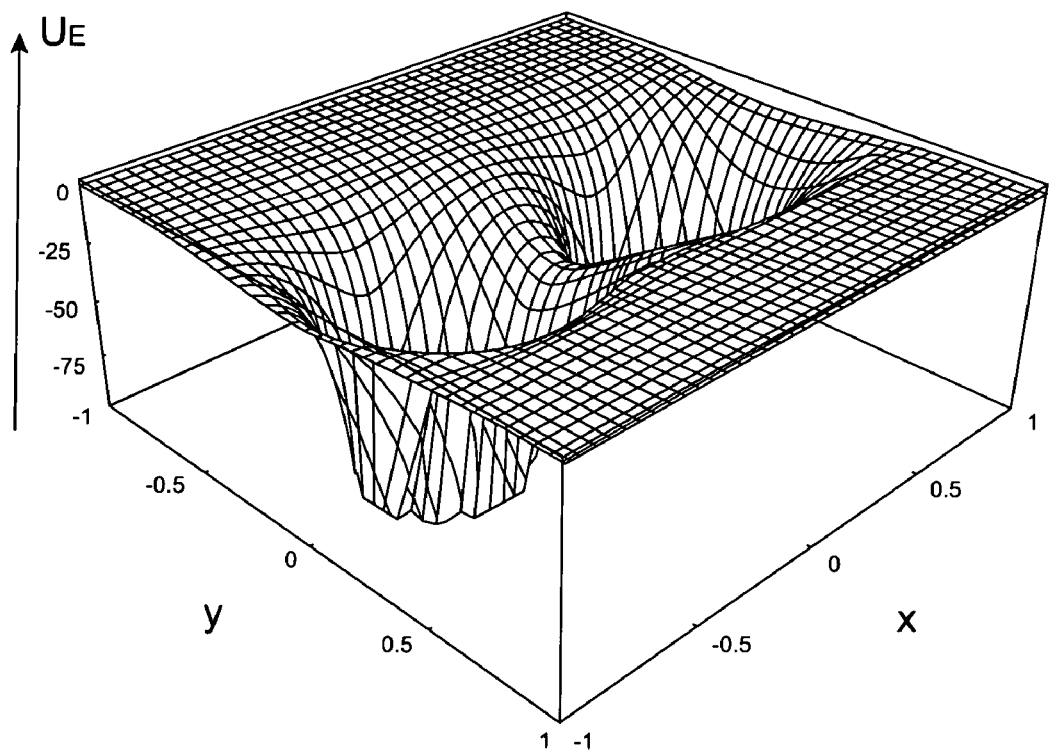

FIGS. 2A and 2B are explanatory views illustrating how to trap a neutral atom in the atomic device shown in FIG. 1. FIG. 2A is a schematic diagram illustrating a coordinate system with the x, y, and z axes and the voltage of each electrode. FIG. 2B is a graph showing the two-dimensional distribution of a Stark potential $U_E$ established by an electric field produced in the state shown in FIG. 2A. In the graph of FIG. 2B, the point at x=y=0 corresponds to the trapping position 30.

As shown in FIG. 2A, in the first state, the electrodes 27 and 28 are at the ground potential G, with the electrode 22 at the positive potential $+V_0$ and the electrode 23 at the negative potential $-V_0$. In the potential $U_E$ produced at that time, FIG. 2B shows that on the y axis at x=0, the potential is minimum at the central position y=0 corresponding to the trapping position 30, this point being the stable point of a neutral atom. On the other hand, on the x axis, the potential decreases from the central position x=0 toward the electrodes 22 and 23.

Next, the applied voltages are switched from the first state to the second state. In the second state, the electrodes 22 and 23 are at the ground potential G, with the electrode 27 at the positive potential $+V_0$ and the electrode 28 at the negative potential $-V_0$. In the potential $U_E$ produced at that time, contrary to the first state, on the x axis, the potential is minimum at the central position x=0 corresponding to the trapping position 30, this point being the stable point for a neutral atom. On the other hand, on the y axis, the potential decreases from the central position y=0 toward the electrodes 27 and 28.

As can be seen from above, in the first state, the neutral atom has the stable point at the central position along the y axis, whereas along the x axis, the neutral atom attempts to move closer to the electrodes 22 and 23. In the second state, the neutral atom has the stable point at the central position along the x axis, whereas along the y axis, the neutral atom attempts to move closer to the electrodes 27 and 28. Accordingly, switching between the two states at a higher frequency than the speed at which the neutral atom moves toward the electrode allows the neutral atom to be trapped while producing infinitesimal motions near the trapping position 30.

Now, a description will be made regarding the effects of the atomic device according to the present embodiment.

The atomic device shown in FIG. 1 makes use of the Stark interaction with an electric field to control neutral atoms. According to such a configuration and atom control method, voltages are applied to the electrodes 22, 23, 27, and 28 on the substrate 1 to control the atom, thus causing only power loss to occur due to the switching of the electric field. Accordingly, the occurrence of Ohmic loss and heat generation resulting therefrom can be avoided, thereby facilitating integration of atomic circuits on the substrate 1.

Furthermore, in such an arrangement, a ground surface could be provided on the substrate to easily avoid a problem which would be an interference of electric fields between atomic circuits, thus enabling high integration of atomic circuits. Since the second-order effect of an electric field is used to control atoms, the coupling of the neutral atom being controlled to its environment or a disturbance is suppressed. Accordingly, such an atomic device is realized which is resistant to decoherence.

Here, the polarizability of the atom in the ground state and the metastable state is such that $\alpha>0$, it is necessary to produce a maximal point of electric field strength in order to trap a neutral atom on the substrate 1. However, from the Maxwell equations, it is not possible to produce such a maximal point in the free space. Therefore, in the atom control method using an electric field, static control cannot serve to trap atoms, and thus dynamic control is required to stabilize atoms. In contrast to this, the aforementioned atomic device has two pairs of electrodes 21 and 26 to provide dynamic control by the switching of the voltage applied thereto. This makes it possible to create a stable trapping position 30 at which the neutral atom is trapped.

In the example above, the electrodes 27 and 28 of the second pair of electrodes 26 in the first state and the electrodes 22 and 23 of the first pair of electrodes 21 in the second state are set to the ground potential as the reference potential to create a good stable point serving as the trapping position 30. However, different potentials may also be acceptable so long as the potentials allow the neutral atom to be stabilized.

As described above, a neutral atom or a neutral molecule can be used as a neutral particle which is trapped on the substrate 1 for use. In particular, it is preferable that the neutral atom or neutral molecule be used which has no spin. In some cases, neutral particles having a spin would cause decoherence to occur due to the coupling between the particle spin with the environment. In contrast to this, for those neutral particles having no spin, a long coherence time can be expected with their quantum state. This is advantageous with respect to the expandability of the atomic circuit. For example, such neutral particles include alkaline earth atoms such as the strontium (Sr) atom which has two electrons in its outermost shell.

Figure 3:
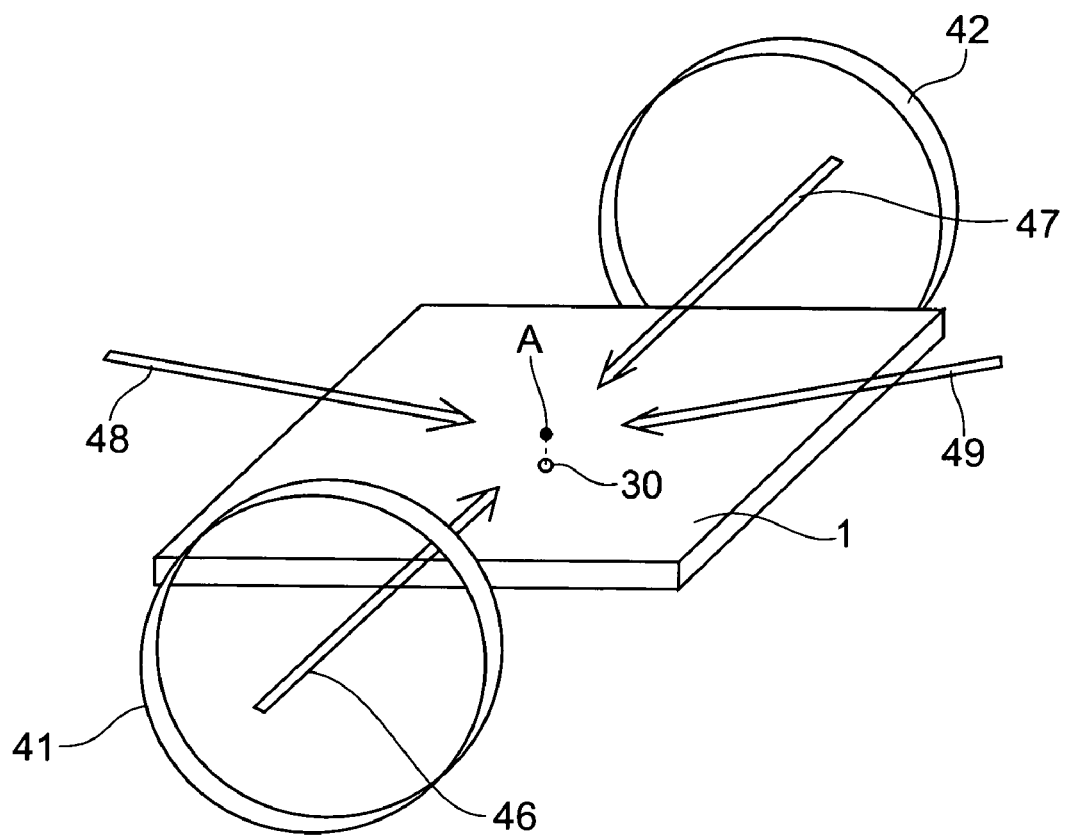
FIG. 3 is a schematic view illustrating how to cool a neutral atom to trap the neutral atom in the atomic device shown in FIG. 1.

Now, an explanation is given for how to cool a neutral atom to trap the neutral atom on the substrate 1 in the atomic device shown in FIG. 1. FIG. 3 is a schematic view illustrating how to cool a neutral atom. In the drawing, only the substrate 1 of the atomic device is illustrated for simplicity without the electrode pattern 2 on the substrate 1. Both the cooling of the neutral atom and trapping on the substrate 1 are carried out in an ultrahigh vacuum.

A neutral atom is cooled using a magneto-optical trap (MOT) technique. A moving atom is illuminated from two opposite directions with laser beams at a frequency shifted in the negative direction from the resonance frequency of the atom. This causes the atom to absorb an oncoming laser beam from the traveling direction, the laser beam now being close to the resonance frequency due to the Doppler shift, and to recoil in the opposite direction. In the laser cooling, such a process can be repeated, thereby making it possible to cool a neutral atom down to a cryogenic temperature of about μK. FIG. 3 shows an arrangement where the cooling position is defined slightly above the trapping position 30 on the substrate 1, and a neutral atom A located at the cooling position is illuminated from four directions with laser beams 46 to 49 used for laser cooling.

In the MOT, in addition to the illumination with the laser beams 46 to 49, anti-Helmholtz coils 41 and 42 are also disposed opposite each other with the neutral atom placed therebetween to use a magnetic field produced by these coils 41 and 42, thereby trapping the cooled neutral atom. Furthermore, control is provided to the magnetic field etc. to move the cooled neutral atom to the trapping position 30, thereby allowing the Stark trapping to proceed by means of the pairs of electrodes 21 and 26 formed on the substrate 1.

Next, an explanation will be given for a specific configuration of a group of electrodes in the atomic device shown in FIG. 1 and switching conditions for applied voltages to each electrode. In general, to trap a neutral atom using the Stark interaction, a relatively large electric field is required even for an atom cooled down to a cryogenic temperature by laser. In contrast to this, the atomic device configured as described above can be micro-structured, thereby realizing control of neutral atoms at a relatively low voltage, e.g., at a TTL level voltage. In such an atom control method, it is necessary to properly define conditions such as the drive frequency for switching between applied voltages to the electrodes in addition to the micro-structured electrodes.

Figure 4:
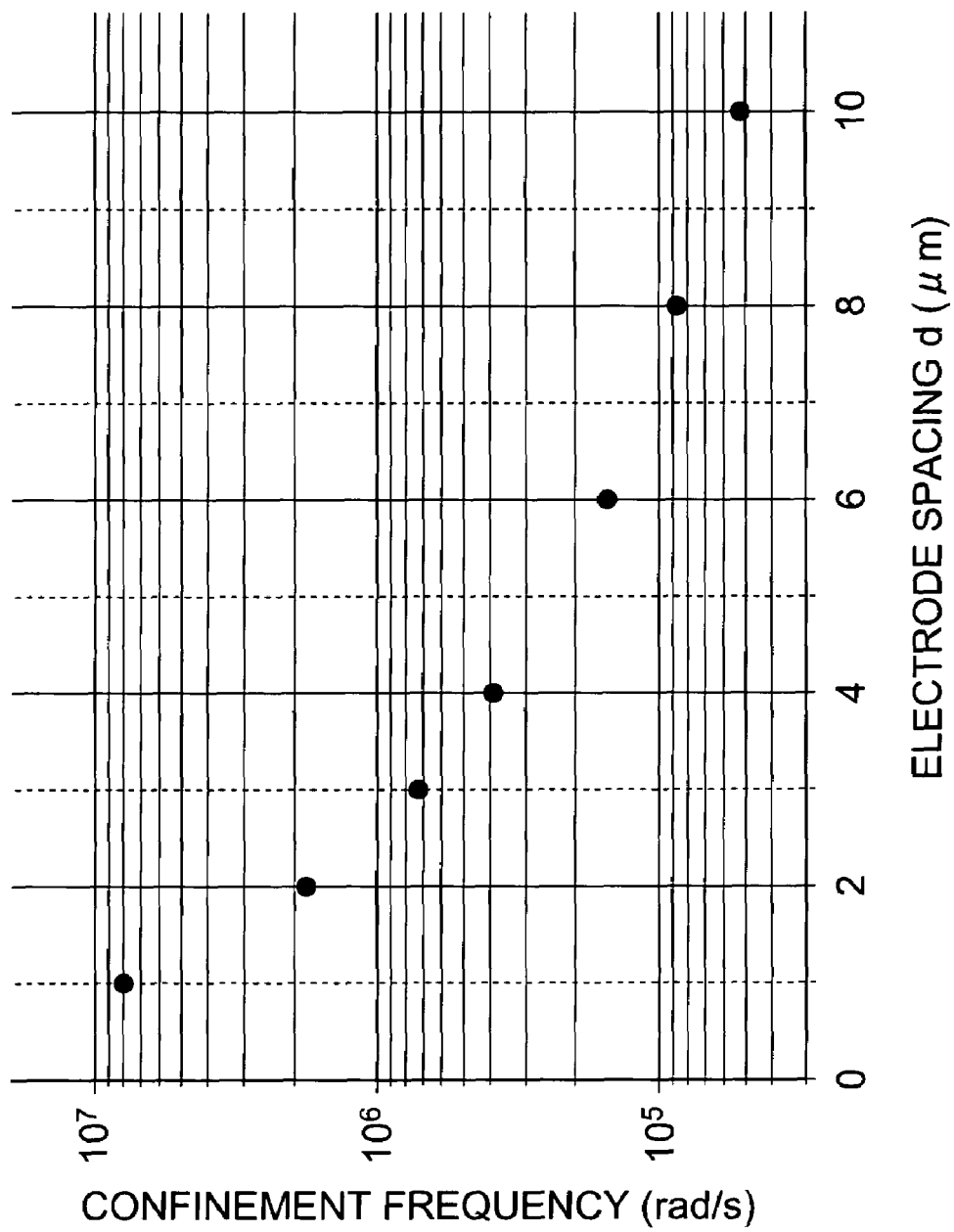
FIG. 4 is a graph showing the correlation between the electrode spacing and the confinement frequency.

FIG. 4 is a graph showing the correlation between the electrode spacing d (in μm along the horizontal axis) and the confinement frequency (in rad/s along the vertical axis). Here, among the Stark potentials produced near the trapping position 30 sandwiched by the pairs of electrodes 21 and 26, the potential in a direction that contributes to the confinement of a neutral atom is considered (see FIG. 2B). The oscillation frequency determined from the static shape of the potential is the confinement frequency for the neutral atom. Additionally, here, the applied voltage to the electrode is set to $V_0=50V$.

According to this graph, the neutral atom is trapped at a frequency of about 60 krad/s with an electrode spacing d=10 μm. Under the condition with a constant voltage $V_0$, the confinement frequency increases as the electrode spacing d reduces. Here, the confinement frequency is proportional to the applied voltage $V_0$ to the electrode, however, the frequency with an electrode spacing d=3 μm is about ten times that with d=10 μm. Accordingly, assuming a constant confinement frequency, with an electrode spacing d=3 μm, the voltage $V_0$ may be about 5V which is less than that with d=10 μm by a factor of about 10.

In this manner, the atomic device configured as above can have the micro-structured electrodes, thereby reducing the voltage $V_0$ required for confinement of the neutral atom. For this electrode structure, the electrode spacing d is preferably 10 μm or less. This allows for trapping the neutral atom at a voltage of about a few tens of volts as described above. Further, with electrode spacing d being 3 μm or less, the neutral atom can be trapped at a voltage of about a few volts, which is widely employed in integrated logic circuits. The micro-structured electrode is also advantageous in reducing the size of or integrating the atomic device.

Figure 5:
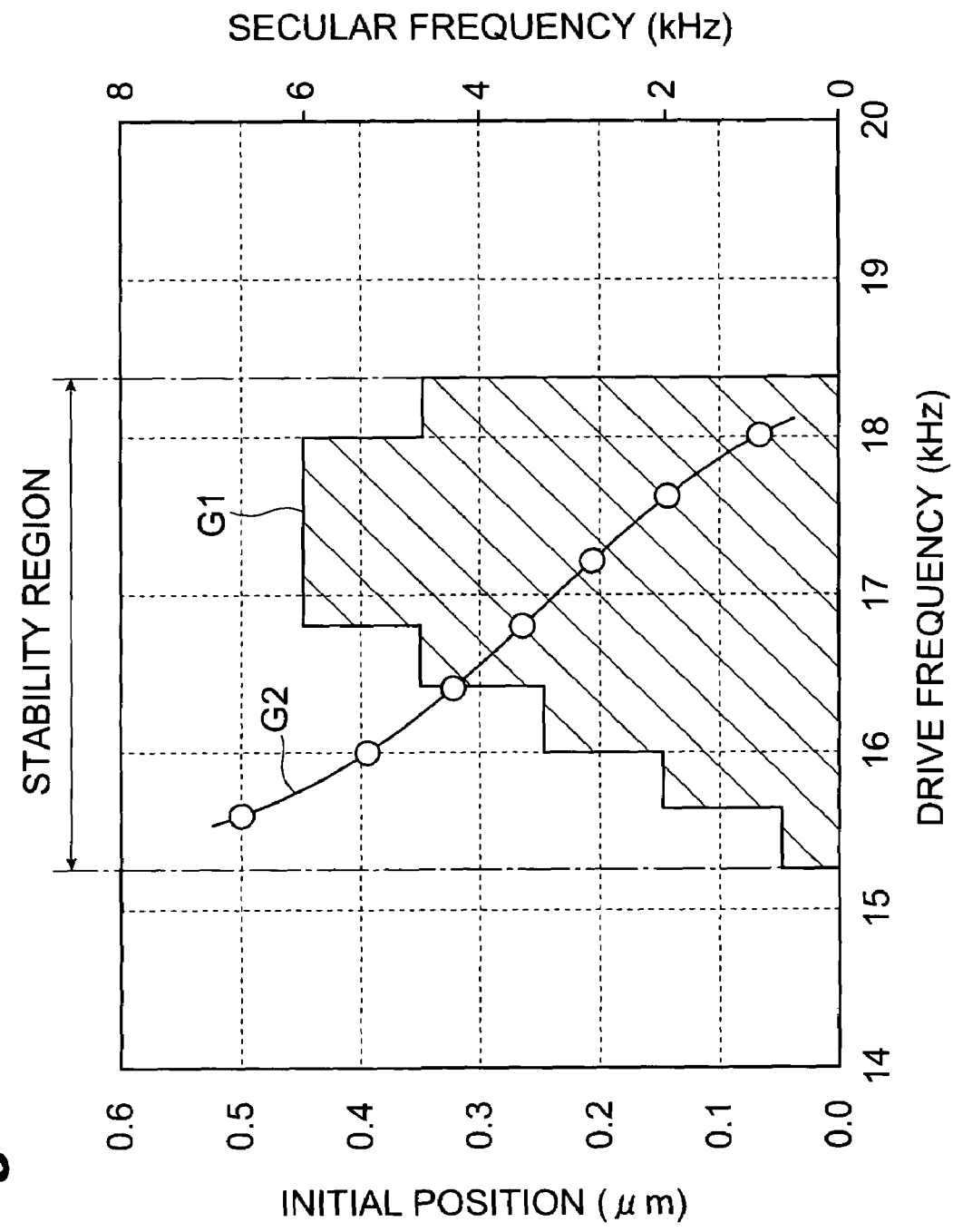
FIG. 5 is a graph showing the stability of a neutral atom when the drive frequency and the initial position are changed.

FIG. 5 is a graph showing an example of the stability of a neutral atom when the drive frequency of a frequency of the applied voltage to the electrode (in kHz along the horizontal axis) and the initial position (in μm along the left axis) are changed. Here, the initial position shows the distance from the trapping position of the neutral atom in the initial state. Here, it is also assumed that the electrode spacing is d=10 μm, the applied voltage is $V_0=50V$, the initial velocity of the neutral atom is 1 mm/s, and the confinement frequency is 60 krad/s.

The graph G1 shows the condition on the initial position at which the neutral atom is trapped with stability, with a region at a lower initial position than that of the graph (i.e., the hatched region shown in the figure) being a stability region. Here, the stability region is obtained over the drive frequency range from about 15.2 to 18.4 kHz. Additionally, at a drive frequency of about 17 kHz, the widest and most stable condition is provided for the allowed initial position. Furthermore, in FIG. 5, a graph G2 shows the correlation between the drive frequency and the secular frequency (in kHz along the right axis) of the motion of the neutral atom. The secular frequency decreases as the drive frequency increases.

Figure 6:
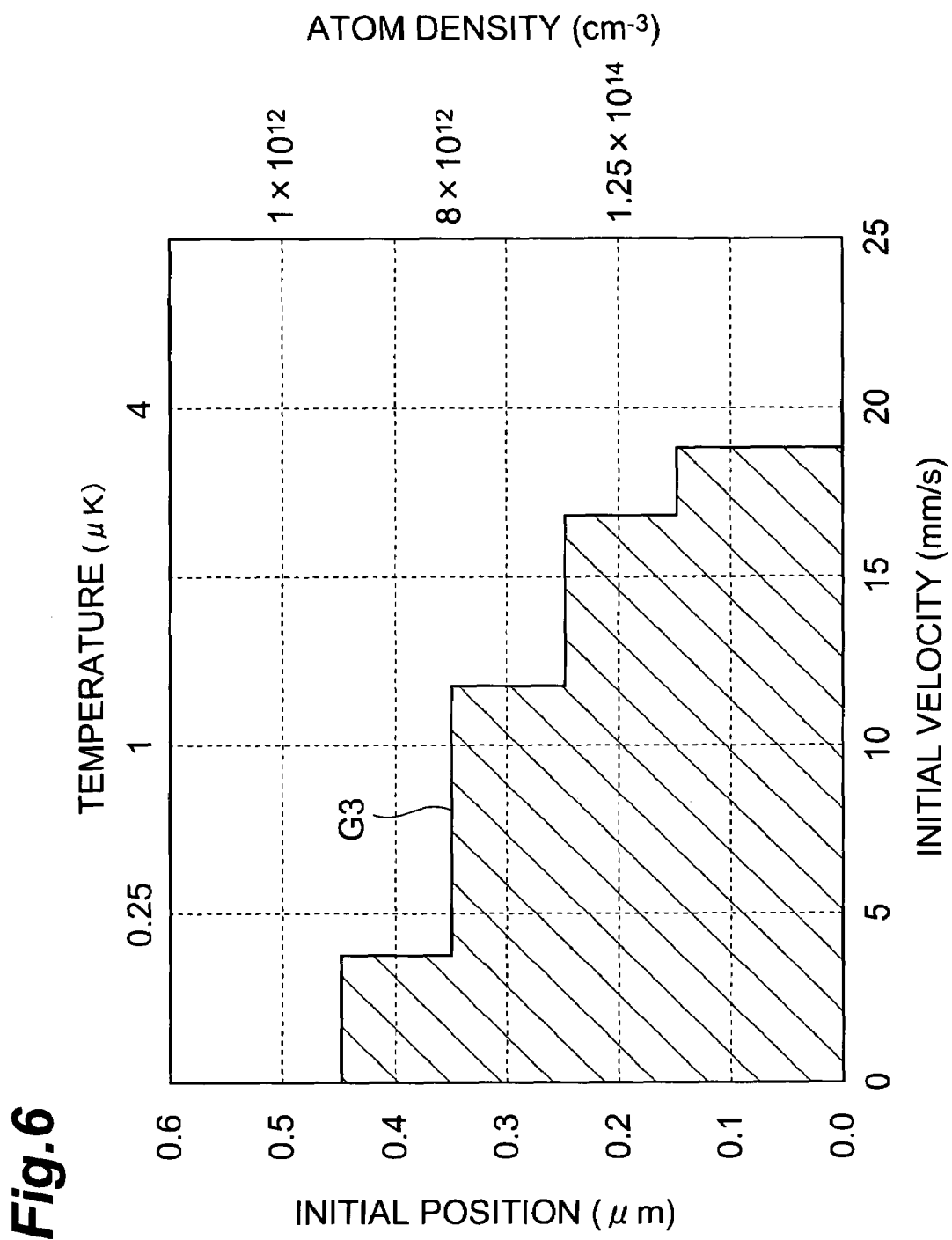
FIG. 6 is a graph showing the stability of a neutral atom when the initial velocity and the initial position are changed.

FIG. 6 is a graph showing an example of the stability of a neutral atom when the initial velocity (in mm/s along the horizontal axis) and the initial position (in μm along the left axis) are changed. Here, it is assumed that the electrode spacing is d=10 μm, the applied voltage is $V_0=50V$, the confinement frequency is 60 krad/s, and the drive frequency is 17 kHz. FIG. 6 also shows the temperature (in μK along the upper axis) and the density of atoms (in $cm^{-3}$ along the right axis) corresponding to the initial velocity and the initial position, respectively.

The graph G3 shows the condition at the initial velocity and the initial position in which the neutral atom is trapped with stability, with a region at a lower initial position than that of the graph (i.e., the hatched region shown in the figure) against each initial velocity being a stability region. As shown in this graph, the neutral atom is cooled down to a sufficiently cryogenic temperature to reduce the initial velocity, this allows for providing a wider condition to the allowed initial position, thereby facilitating trapping of the neutral atom.

Next, an explanation will be given for an interface of the aforementioned atomic device with electronics or photonics as well as application thereof to various atomic circuits.

In the atomic device shown in FIG. 1, the neutral atom trapped on the substrate 1 for use can be optically controlled by illuminating the neutral atom with light or detecting light emitted from the neutral atom. Additionally, use of such an atom control technology makes it possible to realize an interface between the atomtronics using neutral atoms and the photonics using photons.

Figure 7:
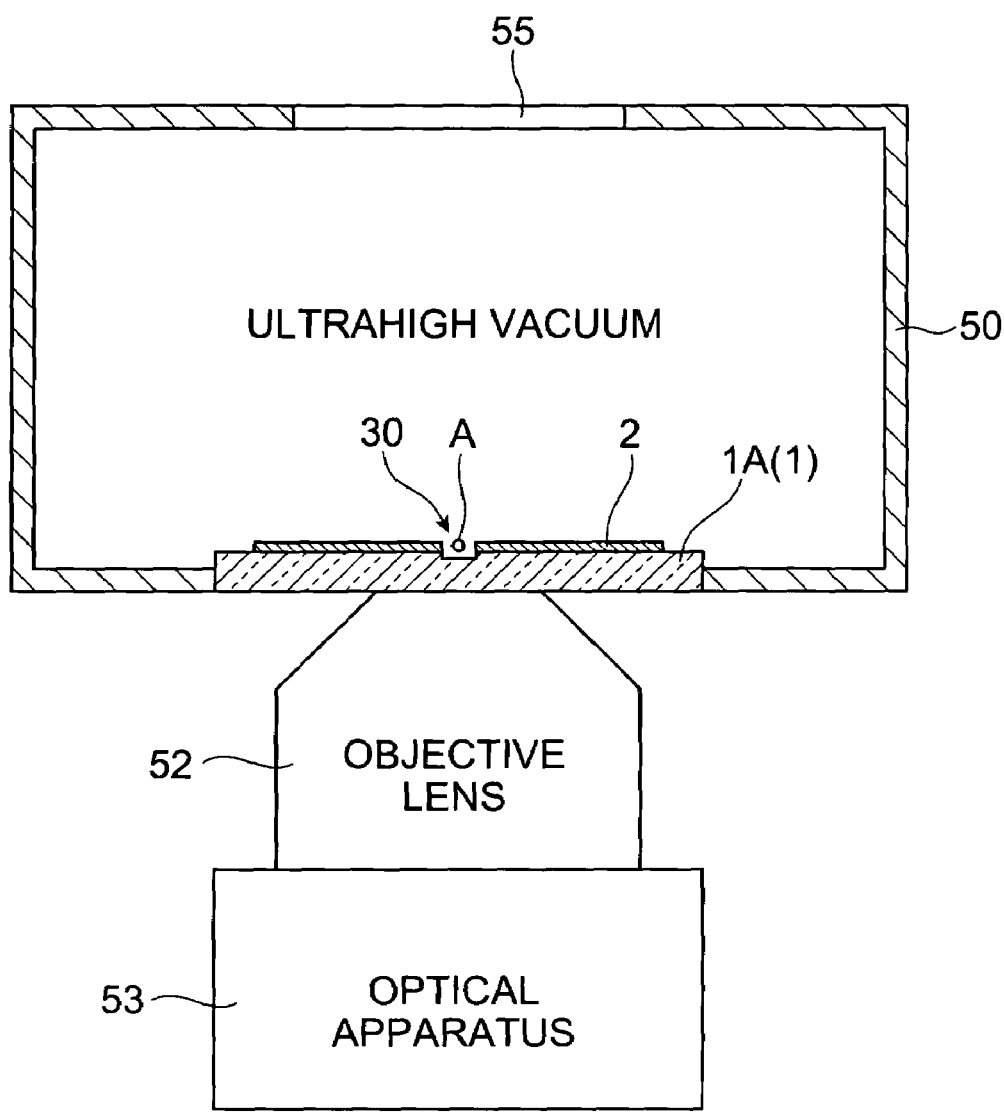
FIG. 7 is a side view illustrating the optical control of a neutral atom in the atomic device shown in FIG. 1.

FIG. 7 is a side view illustrating the optical control of a neutral atom in the atomic device shown in FIG. 1. Here, the atomic device or the like are illustrated in a cross section passing through the trapping position 30. This atomic device employs as the substrate 1, a quartz substrate 1A of a transparent substrate which transmits light of a predetermined wavelength. The atomic device is provided on the quartz substrate 1A with the silver electrode pattern 2 shown in FIG. 1.

The atomic device is disposed within a vacuum vessel 50 in which an ultrahigh vacuum is maintained, with a neutral atom A trapped at the trapping position 30. The quartz substrate 1A of the atomic device constitutes part of the outer wall of the vacuum vessel 50, with an inner side being the surface on which the electrode pattern 2 is provided. This allows the quartz substrate 1A to serve as an optical window through which light of a predetermined wavelength is transmitted. Additionally, an objective lens 52 is disposed near the back of the quartz substrate 1A, with the objective lens 52 being connected with an optical apparatus 53.

With the quartz substrate 1A used for the atomic device having a thickness of 1 mm, such a configuration enables optical control of the neutral atom A by means of the objective lens 52 having a working distance of about 1 mm. At this time, an optical resolution of about 400 nm can be expected. Accordingly, use can be made of this to establish the interfacing technique between atoms and light. For example, a laser source employed as the optical apparatus 53 would make it possible to control the internal state by illuminating the atom A with a laser beam. On the other hand, a photodetecting device employed as the optical apparatus 53 would make it possible to detect the internal state by detecting the light emitted from the atom A.

The aforementioned atomic device made up of the quartz substrate 1A and the silver electrode pattern 2 can be manufactured, e.g., by subjecting a commercially available silver mirror to a focused ion beam (FIB) processing. Such a processing method allows for manufacturing an electrode structure with a minimum electrode spacing d of up to about 100 nm. The thickness w may be set, e.g., to 10 nm or 200 nm, as appropriate, depending on the electrode spacing d or the like. Furthermore, in the arrangement shown in FIG. 7, a recessed portion having a depth of about 10 μm is provided on the quartz substrate 1A in a trapping region including the trapping position 30. This is to prevent a trapped atom A from colliding with the quartz substrate 1A.

Figure 8:
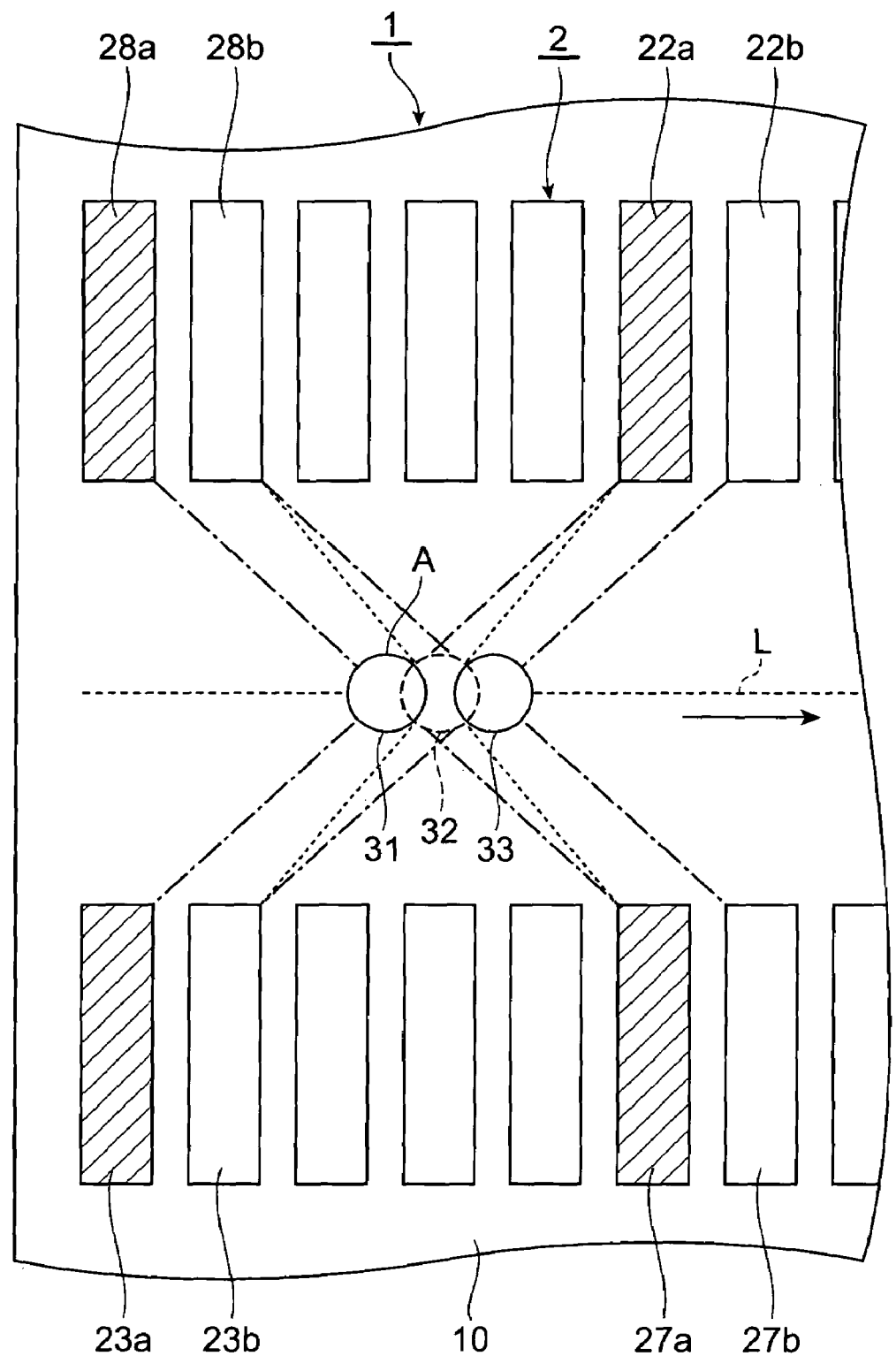
FIG. 8 is a plan view illustrating how to move a neutral atom in an atomic device.

FIG. 8 is a plan view illustrating how to move a neutral atom trapped on the substrate in the atomic device. FIG. 1 shows an arrangement in which a group of electrodes made up of the two pairs of electrodes 21 and 26 for trapping the atom A is provided on the substrate 1. With this arrangement, as shown in FIG. 8, a plurality of trapping positions may be defined on the substrate, and a group of electrodes for trapping the atom A may be provided at each trapping position. This makes it possible to trap the atom A at the trapping position as well as to move the atom A between adjacent trapping positions.

In FIG. 8, a travel line L of the neutral atom A is virtually defined on the surface 10 of the substrate 1. Also provided are an electrode array made up of electrodes 28a, 28b, ..., 22a, 22b, ... and an electrode array made up of electrodes 23a, 23b, ..., 27a, 27b, ... and these two electrode arrays are disposed opposite each other with the travel line L disposed therebetween. The fundamental arrangement of an atomic device having two pairs of electrodes may be extended along the travel line L in this manner. Such an arrangement makes it possible to realize a coherent transport of the neutral atom A as well as various atomic circuits. As described in relation to FIG. 7, such an electrode arrangement can be manufactured by FIB processing, for example.

In the atom control method using the electrode pattern 2 shown in FIG. 8, as shown with the hatching in the figure, a first group of electrodes is formed with the electrodes 22a and 23a employed as a first pair of electrodes and with electrodes 27a and 28a employed as a second pair of electrodes. With this arrangement, control is provided to switch between the aforementioned applied voltages to each of these electrodes, thereby allowing the neutral atom A to be trapped at a corresponding trapping position 31.

Then, the left electrode 23a of the first pair of electrodes is changed to the electrode 23b to form the set of the electrodes 22a and 23b as a first pair of electrodes; and the left electrode 28a of the second pair of electrodes is changed to the electrode 28b to form the set of the electrodes 27a and 28b as a second pair of electrodes; thus a second group of electrodes shifted rightward from the first group of electrodes is configured. The changed electrodes 23a and 28a are set to the ground potential, while the applied voltage is switched for each electrode of the second group of electrodes, thereby allowing the neutral atom A to move along the travel line L to a corresponding trapping position 32, at which it is trapped.

Subsequently, the set of electrodes 22b and 23b is formed as a first pair of electrodes and the set of electrodes 27b and 28b is formed as a second pair of electrodes to form a third group of electrodes further shifted rightward. The changed electrodes 22a and 27a are set to the ground potential, while the applied voltage is switched for each electrode of the third group of electrodes, thereby allowing the neutral atom A to move along the travel line L to a corresponding trapping position 33, at which it is trapped.

In the electrode structure shown in FIG. 8, the width of and the spacing between each electrode are preferably defined so that the distance between adjacent trapping positions (e.g., between the trapping positions 31 and 32) allows the wave functions of the neutral atom A to sufficiently overlap with each other before and after its displacement. This makes it possible to preferably realize the movement of the atom A between the trapping positions.

Such an electrode arrangement can be used as an atomic guide which allows a neutral atom A trapped on the substrate 1 to move in a macroscopic manner. Further, use of an atom to which information is attached as the neutral atom A would allow the arrangement to be utilized as an atom shift register which transfers information by sequentially moving the atom A between adjacent trapping positions. Furthermore, such an electrode arrangement may be provided so that two neutral atoms, to which information is attached respectively, can be trapped on the substrate 1 for use in order to realize a "controlled collision" between these atoms to provide a quantum correlation. This makes it possible to apply the atomic device to various applications such as quantum information processing and quantum computing.

For example, the quantum computing employs a "quantum bit (qubit)" which has been extended from the classical "bit." The quantum bit is characterized by taking a state "0," a state "1," and a superposition state thereof. It is also possible to provide a plurality of quantum bits with a quantum correlation that is referred to as the "quantum entanglement". When two quantum bits are in the quantum entanglement state, the bits cannot take on independent quantum states. In the aforementioned atomic device, it is possible to realize the state control of the neutral atom A corresponding to such a quantum bit or the quantum correlation control of two neutral atoms A corresponding to the quantum entanglement of two quantum bits. Now, an explanation will be given for an exemplary configuration of such an atomic device.

Figure 9:
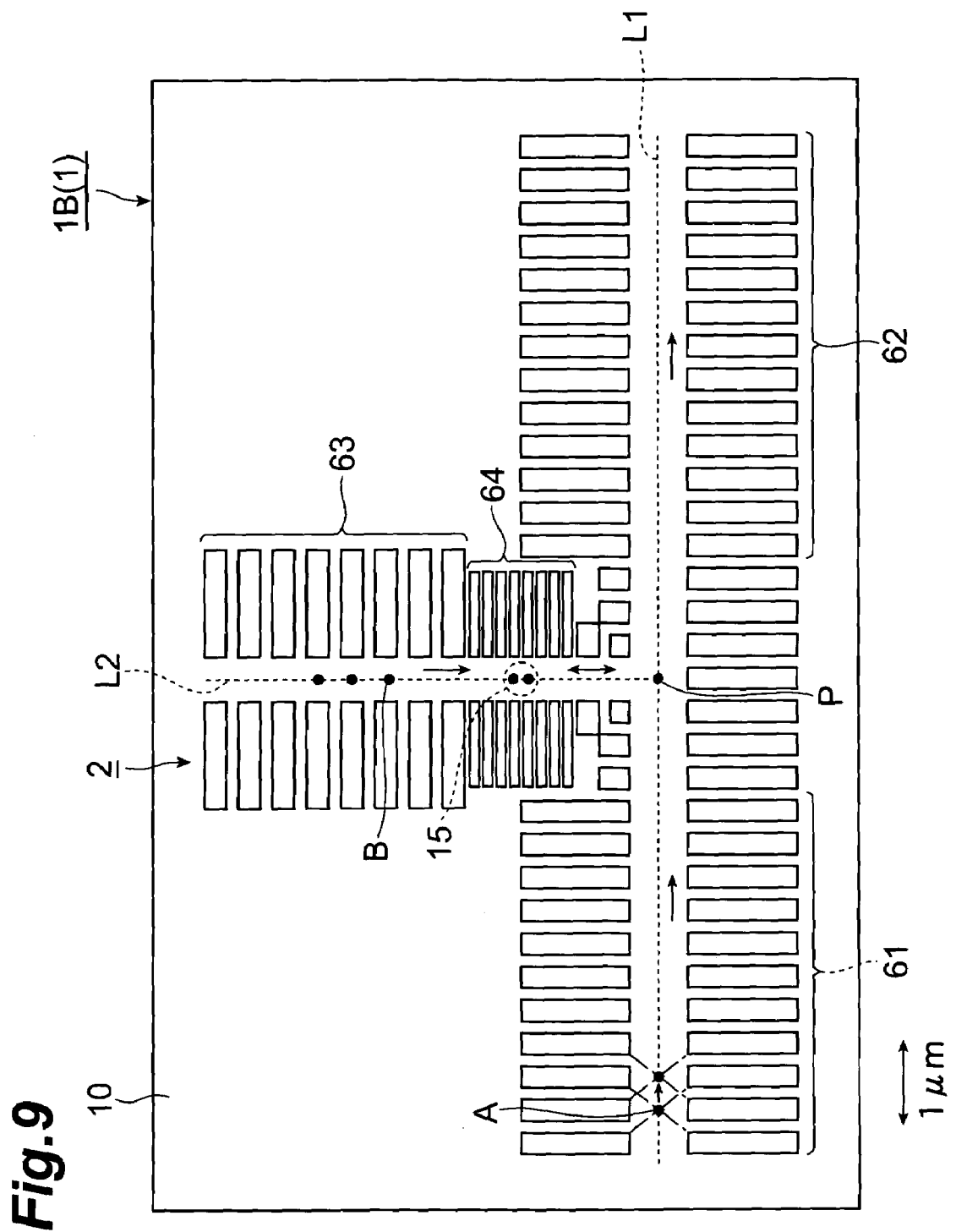
FIG. 9 is a plan view illustrating the configuration of an atomic device according to another embodiment.

FIG. 9 is a plan view illustrating the configuration of an atomic device according to another embodiment. This atomic device employs as the substrate 1, a quartz substrate 1B of a transparent substrate which transmits light of a predetermined wavelength. The atomic device is provided on the quartz substrate 1B with the electrode pattern 2.

In this embodiment, a first travel line L1 extending in the horizontal direction of the figure is defined for a neutral atom A to be trapped or moved on the quartz substrate 1B. A branch point P at which the travel line is branched is provided substantially at the center of the first travel line L1, and a second travel line L2 is defined which extends from the branch point P in a direction orthogonal to the first travel line L1. The electrode pattern 2 is configured to allow the neutral atom A to move sequentially along these travel lines L1 and L2.

More specifically, an electrode pattern to serve as an atom guide portion 61 is formed on the left portion of the branch point P on the first travel line L1. Additionally, an electrode pattern to serve as an atom shift register portion 62 is formed on the right portion of the branch point P on the first travel line L1.

On the other hand, an electrode pattern to serve as a FIFO memory portion 63 is formed on the portion opposite to the branch point P on the second travel line L2. Additionally, an electrode pattern to serve as an atom colliding portion 64 is formed on the portion closer to the branch point P on the second travel line L2. The basic electrode pattern structure of each of these portions 61 to 64 as well as the method for trapping and moving the neutral atom A using the electrode arrangement are the same as those described with reference to FIG. 8.

Now, an explanation will be given for an example of a method for controlling the neutral atom A using the atomic device configured as such. First, a neutral atom A that has been cooled down to a cryogenic temperature is supplied from an atom source (not shown) to the atom guide portion 61. The atom A is trapped at the trapping position corresponding to a group of electrodes that is made up of two pairs of electrodes which are located at the left end portion of the atom guide portion 61. Then, the atom A is moved towards the branch point P by sequentially operating a plurality of groups of electrodes disposed along the first travel line L1.

Additionally, as shown in FIG. 7, the objective lens and the optical apparatus are disposed via the quartz substrate 1B for the branch point P. This allows for controlling or detecting the internal state with a resolution of about 400 nm with respect to the atom A that has reached the branch point P from the atom guide portion 61. This corresponds to writing or reading of a quantum bit. Additionally, the atom shift register (atom memory) 62 is thus created which transfers information by sequentially moving such quantum bit controlled atoms A.

On the other hand, it is possible to accumulate other neutral atoms B in the FIFO memory portion 63. In the atom colliding portion 64 sandwiched by the FIFO memory portion 63 and the branch point P, the width and spacing of the electrodes are less than those of the other portions 61 to 63. In such an arrangement, the atom A that has been quantum bit controlled at the branch point P and the atom B that has been accumulated in the FIFO memory portion 63 are each moved into the atom colliding portion 64 as close to each other until a distance of about 100 nm in an atom colliding region 15.

This makes it possible to realize a controlled collision between the two atoms A and B to provide a quantum correlation (quantum entanglement) thereto. That is, such a branch structure to the FIFO memory portion 63 realizes a Stark atom chip which enables formation of a quantum correlation between any atoms in an atom sequence and thereby quantum computing. In this manner, the atomic device according to the present invention is largely characterized by being widely expandable, thus making it possible to manufacture various atomic circuits by combining single atomic operations provided by means of a group of electrodes each including a fundamental unit of two pairs of electrodes. It is also possible to build an information processing system, together with a cryogenic temperature atom source, in a size of about a few centimeters such as by providing a microstructure to the electrodes.

As shown in FIG. 7, such an atom chip needs to be housed in the vacuum vessel 50 in which an ultrahigh vacuum is maintained. As the vacuum vessel 50, a vacuum chamber can be used to which a vacuum pump is connected. Alternatively, it is also acceptable to use a package, similar to that of a semiconductor device, to which added are an atom source of a few centimeters per side and a compact ion pump.

Further, as described above in relation to FIG. 7, the optical window used for optical access which is to be provided in the vacuum vessel for the atom chip may be the transparent substrate itself, which can be used as an optical window accessible to the atom A from below the substrate. A separate optical window may also be provided below the transparent substrate. Alternatively, as shown in FIG. 7, an optical window 55 may be provided which is accessible to the atom A from above the substrate. When the optical window provided above the substrate is used, a substrate that transmits no light may be used. Additionally, each electrode of the electrode pattern 2 can be controlled using a CMOS logic gate circuit formed on the same chip or a gate circuit on another chip arranged in parallel thereto.

Figure 10:
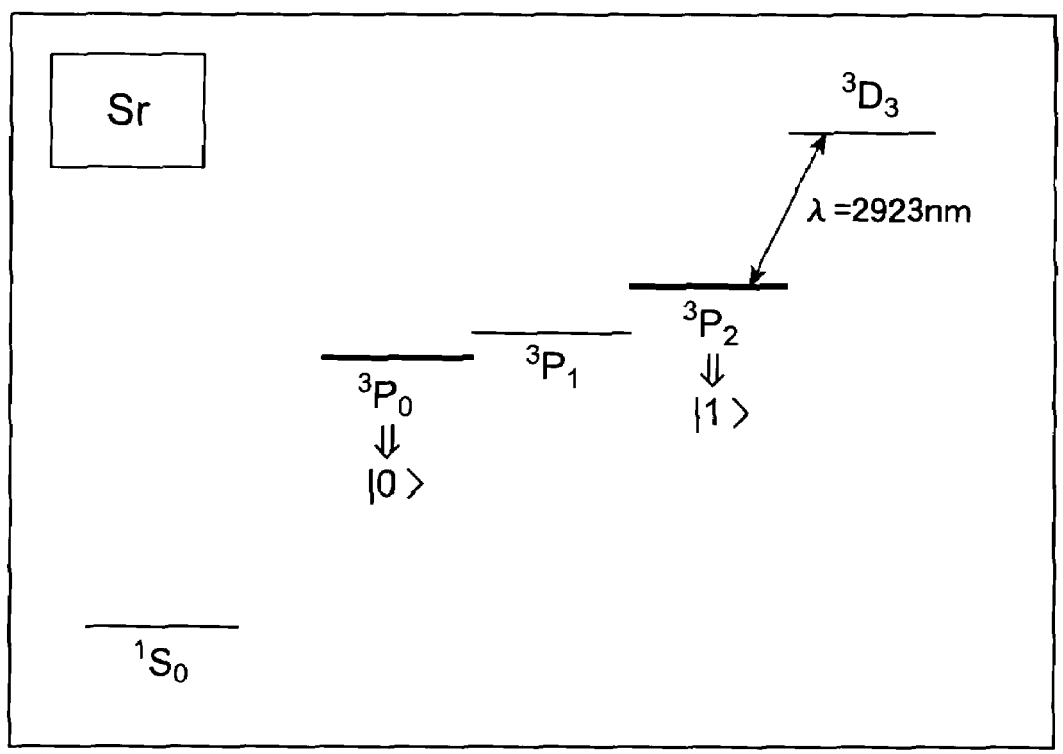
FIG. 10 is an energy level diagram of a strontium atom.

Now, an explanation will be given more specifically for the writing and reading of the quantum bits on the neutral atoms A and providing the quantum entanglement to the neutral atoms A in accordance with an example of the strontium (Sr) atom which is an alkali earth atom. FIG. 10 is an energy level diagram of a Sr atom. The Sr atom has the $^1S_0$ state as the ground state in which two electrons in the outermost shell are in the $5S^2$ state, and has as the excited states thereof the three excited states $^3P_0$, $^3P_1$, and $^3P_2$, and an excited state $^3D_3$ in ascending order of energy, as shown in FIG. 10. Here, among these excited states, it is assumed that the $^3P_0$ state is a quantum bit 0 state |0>, while the $^3P_2$ state is a quantum bit 1 state |1>. Additionally, light of a wavelength $\lambda=2923$ nm can cause a transition between the $^3P_2$ state and the $^3D_3$ state.

Figure 11A:
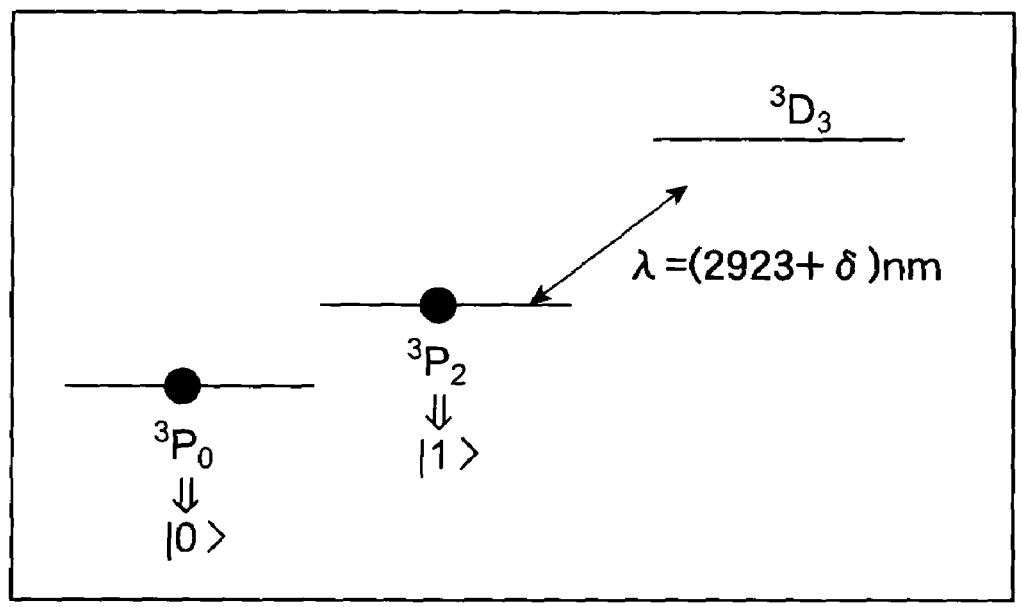
FIGS. 11A and 11B are views illustrating how to provide a quantum correlation to two strontium atoms.
Figure 11B:
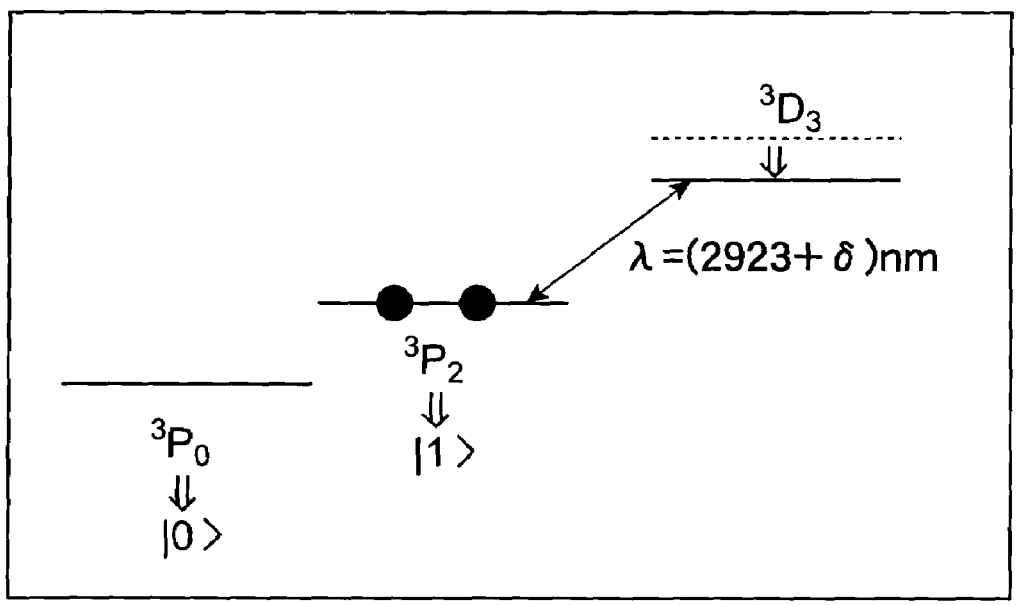

Consider a case in which a quantum correlation (quantum entanglement) is provided to two Sr atoms using the Sr atom having such an energy level. FIGS. 11A and 11B are views illustrating how to provide a quantum correlation to two Sr atoms. Here, it is also assumed that the two Sr atoms in close proximity to each other in an atom colliding region provided on the substrate of the atomic device are illuminated with light of a wavelength $\lambda=(2923+\delta)$ nm that has been shifted by a predetermined amount of shift $\delta$.

FIG. 11A is a level diagram illustrating the two Sr atoms where one is in the |0> state and the other is in the |1> state. At this time, since one Sr atom in the |1> state can make a transition to the $^3D_3$ state by light of wavelength 2923 nm, such a state transition will not be effected even when being illuminated with the light of the aforementioned wavelength. Therefore, no quantum correlation is provided to the two Sr atoms.

On the other hand, FIG. 11B is a level diagram illustrating the two Sr atoms where both atoms are in the |1> state. At this time, a resonance dipole interaction between the two Sr atoms in the |1> state will cause the energy level of the $^3D_3$ state to be lowered. This causes the two Sr atoms in the |1>|1> state to transition to the $^3D_3$ state with the light of a wavelength (2923+δ) nm, thus providing a quantum correlation between these Sr atoms. As described above, it is possible to realize a CPHASE gate using the Sr atom.

In the case that the Sr atom is used as the neutral atom A as above, a two-step laser cooling method is employed to laser cool an atom down to a cryogenic temperature; one step of cooling through allowed transition to the $^1P_1$ state (λ=461 nm) and the other step of cooling through forbidden transition to the $^3P_1$ state (λ=689 nm).

Figure 12:
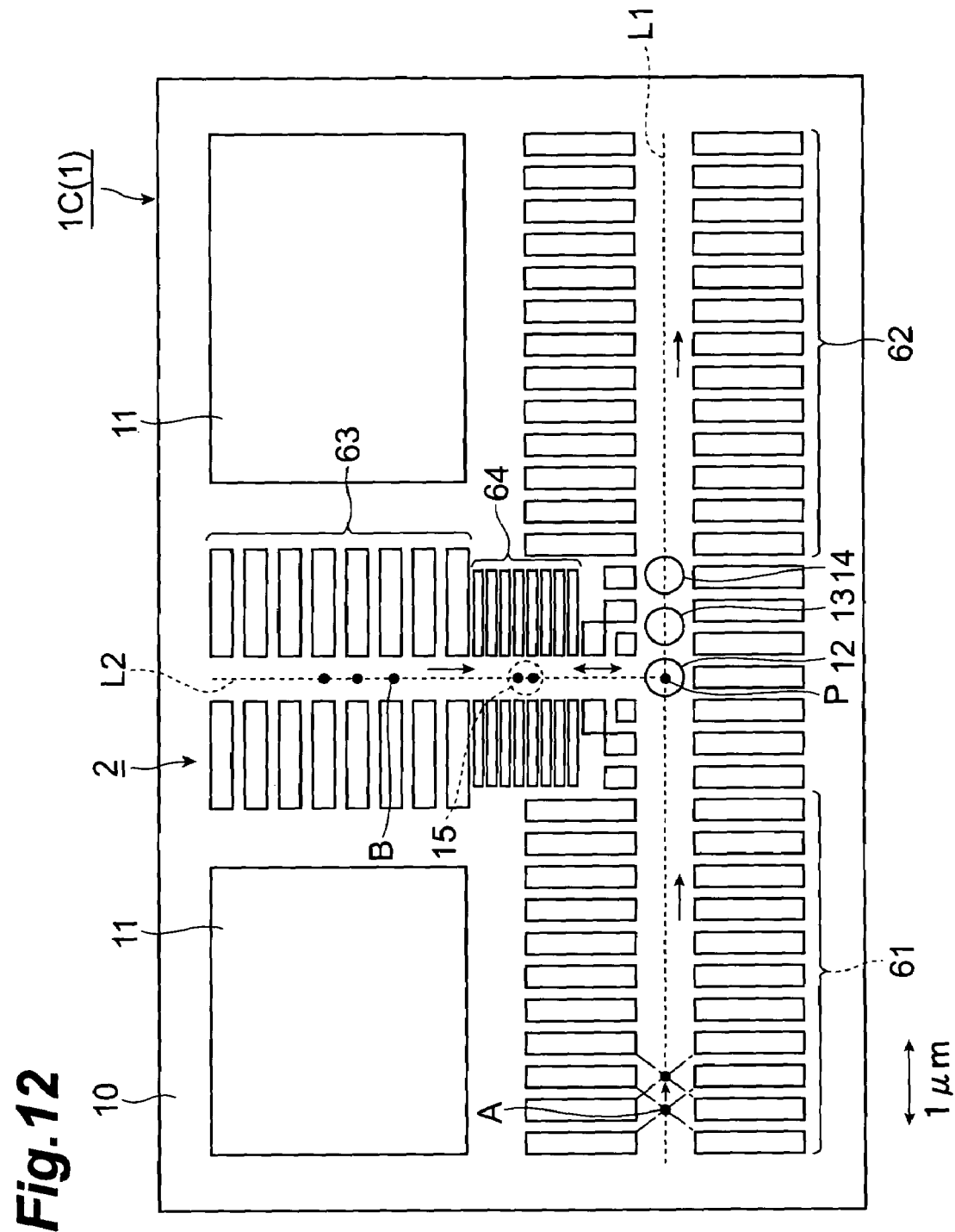
FIG. 12 is a plan view illustrating the configuration of an atomic device according to another embodiment.

FIG. 12 is a plan view illustrating the configuration of an atomic device according to another embodiment. This atomic device has a silicon (Si) substrate 1C of a semiconductor substrate as the substrate 1, and is provided with the electrode pattern 2 on the Si substrate 1C. The electrode pattern 2 is configured in the same manner as in FIG. 9, and has the atom guide portion 61, the atom shift register portion 62, the FIFO memory portion 63, and the atom colliding portion 64.

The atomic device according to this embodiment is configured as an atom-opto-electronic IC (AOEIC) which is formed of an atomic device, an optical device, and an electronic device that are integrated on the Si substrate 1C.

That is, in the atomic device shown in FIG. 12, there is formed a laser diode 12 at a portion within the Si substrate 1C in close proximity to the branch point P of the travel lines L1 and L2. A photo diode 13 and a laser diode 14 are also formed at portions within the Si substrate 1C on the first travel line L1 on the right side of the branch point P. These optical devices are used for writing and reading of quantum bits with the neutral atom A trapped on the substrate 1C. Use of the substrate 1C having optical devices formed in this manner for combination of optical and atomic devices would realize an interface between the photonics technology and the information processing technology using the neutral atom A.

Furthermore, at a predetermined portion within the Si substrate 1C, there is formed an electronic device such as a CMOS logic gate circuit which controls an applied voltage to each electrode that constitutes the electrode pattern 2. FIG. 12 schematically shows electronic device portions 11 which are provided on both the right and left sides of the FIFO memory portion 63. Use of the substrate 1C having the electronic devices formed in this manner for combination of electronic and atomic devices would realize an interface between electronics technology and information processing technology using the neutral atom A.

The atomic device according to the present invention is not limited to the aforementioned embodiments, but various modifications can be made thereto. For example, the Sr atom has been taken by way of example as a neutral particle that is to be trapped on the substrate for use; however, other various neutral atoms or neutral molecules may also be used.

INDUSTRIAL APPLICABILITY

As described above in detail, the atomic device according to the present invention can be applied as an atomic device which can facilitate integration of atomic circuits as well as reduce disturbances or the like. That is, the trapping position of a neutral particle is defined on the substrate with two pairs of electrodes provided opposite each other to sandwich the trapping position, and the dynamic control for alternately switching an applied voltage to each electrode between two states is employed to create a stable point at which the neutral particle is trapped. This arrangement prevents the occurrence of Ohmic loss and heat generation otherwise resulting therefrom, thus facilitating integration of atomic circuits on the substrate. Further, the arrangement for controlling an atom using an electric field allows for easily avoiding the interference of the electric field between the atomic circuits by providing a ground surface on the substrate. These effects provide the atomic device with a high degree of integration of atomic circuits.

As can be seen from the Stark potential equation $U_E=-\alpha|E|^2/2$, the aforementioned arrangement makes use of the second-order effect of the electric field to control a particle. This allows for suppressing the coupling of the particle being controlled by its environment or a disturbance. Accordingly, such an atomic device is realized which is resistant to decoherence.

The invention claimed is:

1. An atomic device using a neutral particle which is a neutral atom or a neutral molecule, comprising
   a first pair of electrodes provided at positions on a substrate with a trapping position disposed therebetween, and along a first axis passing through the trapping position, the trapping position being defined at a predetermined position on the substrate, and
   a second pair of electrodes provided at positions on the substrate with the trapping position disposed therebetween, and along a second axis provided at a predetermined angle to the first axis and passing through the trapping position, wherein
   the atomic device switches between a first state and a second state alternately to trap a neutral particle at the trapping position, one of the electrodes of the first pair of electrodes being set at a positive potential with respect to a reference potential and the other electrode being set at a negative potential in the first state, one of the electrodes of the second pair of electrodes being set at a positive potential with respect to the reference potential and the other electrode being set at a negative potential in the second state.

2. The atomic device according to claim 1, wherein the two electrodes of the second pair of electrodes are set at the reference potential in the first state, and the two electrodes of the first pair of electrodes are set at the reference potential in the second state.

3. The atomic device according to claim 1, wherein the neutral particle is a neutral atom or a neutral molecule having no spin.

4. The atomic device according to claim 1, wherein a group of electrodes made up of the first pair of electrodes and the second pair of electrodes has an electrode spacing of 10 μm or less.

5. The atomic device according to claim 1, wherein the substrate is a semiconductor substrate on which an electronic device or an optical device is formed.

6. The atomic device according to claim 1, wherein the substrate is a transparent substrate which transmits light of a predetermined wavelength.

7. The atomic device according to claim 1, wherein a plurality of the trapping positions are defined on the substrate, a group of electrodes made up of the first pair of electrodes and the second pair of electrodes is provided for each of the plurality of trapping positions, and a potential of each electrode included in the plurality of groups of electrodes is switched, thereby trapping the neutral particle at the trapping position and moving the neutral particle between the trapping positions adjacent to each other.

8. The atomic device according to claim 7, wherein the atomic device uses the neutral particle to which information is attached, and the plurality of groups of electrodes are formed as an atom shift register for transferring the information by sequentially moving the neutral particle between the trapping positions adjacent to each other.

9. The atomic device according to claim 7, wherein the atomic device uses at least two of the neutral particles to which information is attached, and the plurality of groups of electrodes are formed to be able to provide a quantum correlation to the two neutral particles.

* * * * *